US012661808B2

(12) United States Patent
Schiavone Scafato et al.

(10) Patent No.: US 12,661,808 B2
(45) Date of Patent: Jun. 23, 2026

(54) ROBOT TORSO WITH A THERMAL MANAGEMENT

(71) Applicant: ANYBOTICS AG, Zurich (CH)

(72) Inventors: Alessandro Schiavone Scafato, Schwerzenbach (CH); David Sekanina, Zurich (CH); Simon Mark Holt, Ermenswil (CH); Taihei Ueno, Zurich (CH); Severin Aregger, Zurich (CH); Marco Pagnamenta, Schwerzenbach (CH)

(73) Assignee: ANYBOTICS AG, Zurich (CH)

( * ) Notice: Subject to any disclaimer, the term of this patent is extended or adjusted under 35 U.S.C. 154(b) by 177 days.

(21) Appl. No.: 18/284,110

(22) PCT Filed: Mar. 31, 2021

(86) PCT No.: PCT/EP2021/058437
§ 371 (c)(1),
(2) Date: Sep. 26, 2023

(87) PCT Pub. No.: WO2022/207092
PCT Pub. Date: Oct. 6, 2022

(65) Prior Publication Data
US 2024/0300121 A1 Sep. 12, 2024

(51) Int. Cl.
*B25J 19/00* (2006.01)
*G03B 17/55* (2021.01)
*H05K 7/20* (2006.01)

(52) U.S. Cl.
CPC .......... *B25J 19/0054* (2013.01); *G03B 17/55* (2013.01); *H05K 7/20154* (2013.01); *H05K 7/2039* (2013.01)

(58) Field of Classification Search
CPC . B25J 19/0054; G03B 17/55; H05K 7/20154; H05K 7/2039; B62D 57/02
See application file for complete search history.

(56) References Cited

U.S. PATENT DOCUMENTS

| | | | | |
|---|---|---|---|---|
| 2005/0227610 A1* | 10/2005 | Zukor | .................... | G03B 17/02 |
| | | | | 454/339 |
| 2006/0128261 A1* | 6/2006 | Kawabe | ............... | B25J 19/0054 |
| | | | | 446/268 |

(Continued)

FOREIGN PATENT DOCUMENTS

| | | | | | |
|---|---|---|---|---|---|
| JP | 2003071775 A | * | 3/2003 | .......... | B25J 19/0054 |
| JP | 4533947 B2 | | 9/2010 | | |
| JP | 4776158 B2 | | 9/2011 | | |

OTHER PUBLICATIONS

International Search Report for Application No. PCT/EP2021/058437 dated Jan. 28, 2022.

(Continued)

*Primary Examiner* — Fabio S Lima
(74) *Attorney, Agent, or Firm* — MARSHALL, GERSTEIN & BORUN LLP; Michael P. Furmanek

(57) ABSTRACT
A robot torso 100, in particular for a legged robot, comprising a housing wall 1 with an inner surface and an outer surface, and at least one unit integrated into the housing wall 1. The at least one unit is selected from the list consisting of a cooling unit 200 for cooling a heat source 11 inside the torso 100, a sensor unit 300, or a face sensor unit 400. The at least one unit comprises a heat source arranged inside the torso 100 and thermally coupled to the housing wall 1, and a heat sink arranged outside the torso 100 and thermally coupled to the housing 1 wall for cooling the heat source. The housing wall 1 is essentially hermetically sealing the torso 100.

16 Claims, 6 Drawing Sheets

(56)     References Cited

U.S. PATENT DOCUMENTS

| | | | | |
|---|---|---|---|---|
| 2019/0320555 A1* | 10/2019 | Flavin | ................ | H05K 7/20409 |
| 2020/0029461 A1* | 1/2020 | Yang | ...................... | B25J 11/008 |
| 2020/0117198 A1* | 4/2020 | Whitman | ............... | G05D 1/247 |
| 2020/0309913 A1* | 10/2020 | Oliveira | .................... | F28F 5/00 |
| 2020/0355379 A1* | 11/2020 | Kim | ...................... | F28F 13/125 |
| 2022/0140433 A1* | 5/2022 | Raettich | ........... | H01M 10/6569 |
| | | | | 429/56 |

OTHER PUBLICATIONS

Written Opinion for Application No. PCT/EP2021/058437 dated Jan. 28, 2022.

\* cited by examiner

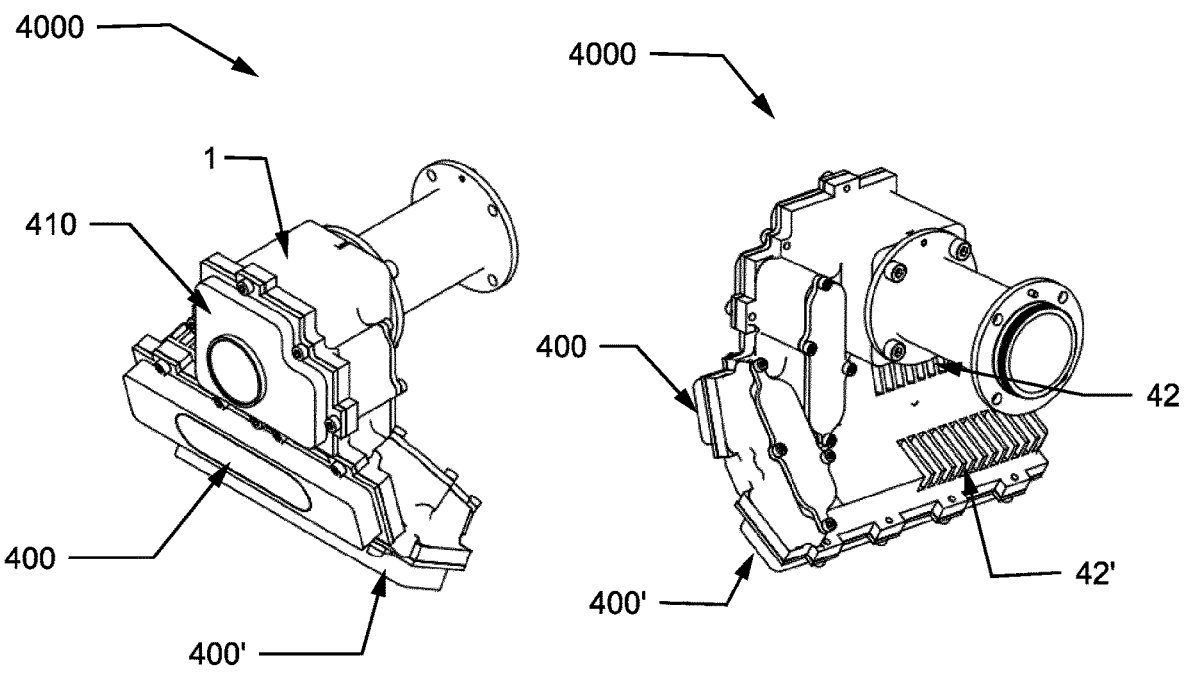
Fig. 5a
Fig. 5b
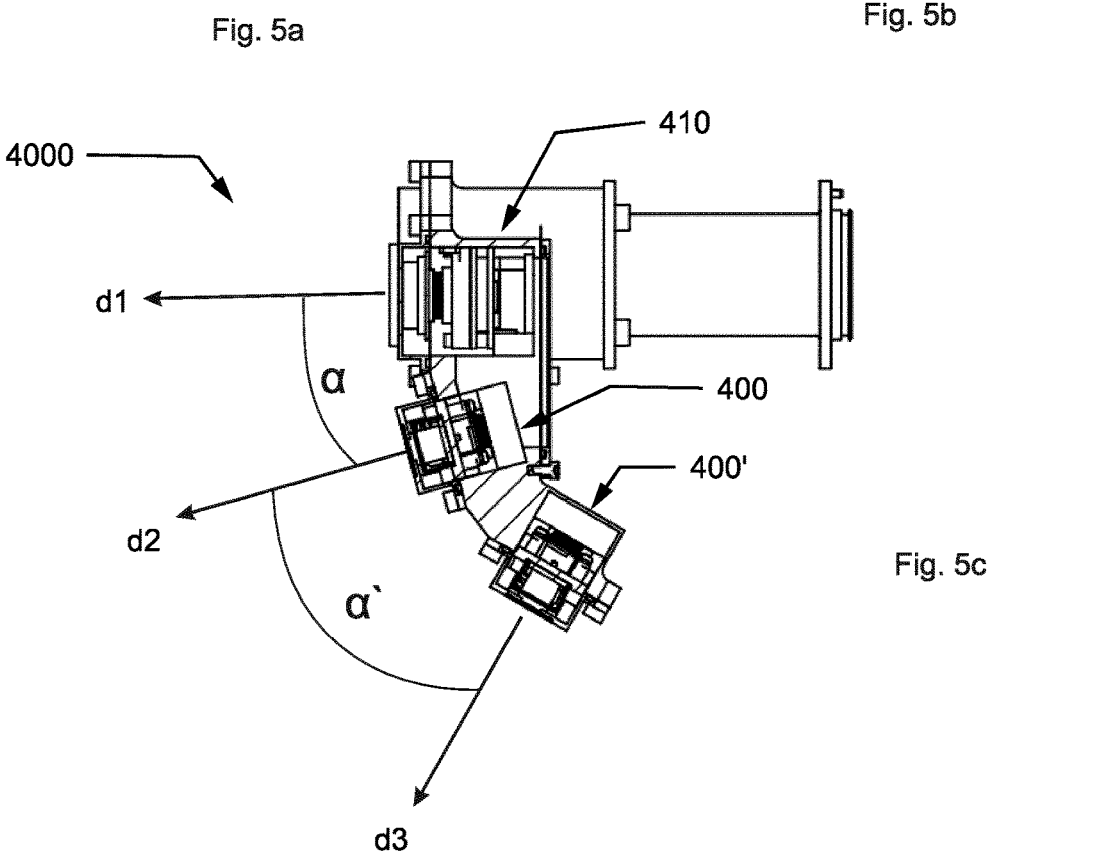
Fig. 5c

ROBOT TORSO WITH A THERMAL MANAGEMENT

CROSS-REFERENCE TO RELATED APPLICATIONS

This is the U.S. national phase of International Patent Application No. PCT/EP2021/058437, filed Mar. 31, 2021, the entire contents of which are hereby incorporated by reference herein.

FIELD OF THE DISCLOSURE

The invention relates in a first aspect to a robot torso, in particular for a legged robot, and in a second aspect to a robot comprising the torso.

BACKGROUND

Autonomous robots are used for various tasks, in particular for replacing human work in hazardous environments. For example, robots are working on oil platforms which is an environment with a high risk for explosions.

Oil and gas facilities require continuous monitoring and frequent inspections to enable high availability and safety. An autonomous legged robot might be used to perform an automated routine to inspect such facilities. During such an inspection, the robot, in particular the torso of the robot, might be exposed to environmental conditions that might not be favourable for the sensitive electronic components and sensors attached to the robot, e.g. exposure to heat or water. In particular, since sensors are attached to the robot for surveillance of the environment, the connectors to these sensors might be affected by environmental conditions and break already after only few applications.

SUMMARY

The problem to be solved by the present invention is therefore to provide a robot torso for robots used in demanding environments.

The problem is solved by the subjects of the independent claim according to a first aspect of the invention.

Unless otherwise stated, the following definitions shall apply in this specification:

The terms "a", "an", "the" and similar terms used in the context of the present invention are to be construed to cover both the singular and plural unless otherwise indicated herein or clearly contradicted by the context. Further, the terms "including", "containing" and "comprising" are used herein in their open, non-limiting sense. The term "containing" shall include both, "comprising" and "consisting of".

Advantageously, the term "robot torso" or "torso" refers to a main body of a robot comprising the logic components for controlling the robot and wherein one or more limbs are attached to the torso. In particular, wherein the torso might comprise multiple limbs, e.g. for a legged or quadruped robot.

A first aspect of the invention refers to a robot torso, in particular the robot torso of a legged robot, comprising a housing wall with an inner surface and an outer surface. The housing wall is hermetically sealing, in particular essentially hermetically sealing the torso.

A hermetic sealing is any type of sealing that makes the torso airtight. No air, oxygen or any other gases can stream into the torso or stream out of the torso. In particular, no water can enter the torso.

A hermetic sealing makes the robot withstanding extreme weather situations and ensures a correct and safe functionality of electronic devices inside the torso. Gas pressure inside the torso might be different from gas pressure outside the torso.

In particular, the essentially hermetically sealing refers in particular to a torso comprising membrane interfaces as described below.

At least one unit is integrated, in particular rigidly integrated, into the housing wall. The at least one unit is selected from the list consisting of
a cooling unit for cooling a heat source inside the torso,
a sensor unit,
a face sensor unit, or
a camera unit.

The integration of a unit within the housing wall has a broad meaning. For example, the cooling unit is integrated into the housing wall in a way that heat is transferred between different components of the cooling unit via the housing wall. In case of a sensor unit, the housing wall might be used to thermally isolate the sensor element from heat dissipated from the sensor electronic.

In particular, integration of a unit within the housing unit means that the individual units might be mounted onto openings in the wall of the torso, wherein a part of the unit itself serves as the housing wall. In particular, if such a unit is integrated, wherein a part of the unit itself serves as a housing wall, there is a sealed connection between the part of the unit serving as housing wall and the wall of the torso.

Further particular, the unit might be integrated to a housing wall that serves as a wall of the torso at the same time.

The at least one unit comprises a heat source arranged inside the torso. The heat source is thermally coupled to the housing wall. The at least one unit further comprises a heat sink arranged outside the torso. The heat sink is thermally coupled to the housing wall for cooling the heat source.

Advantageously, the heat sink comprises metallic cooling ribs.

Since the robot torso is hermetically sealed, heat energy cannot easily be disposed into the environment. In contrast, an open torso could be ventilated and the dissipated electric energy could directly be disposed into the environment by convection.

Therefore, to stabilize the thermal conditions within a sealed torso, it is required to take further measures. An efficient heat transfer from a heat source inside the torso to the housing wall and a further heat transfer from the housing wall to the environment provides a solution for dissipating heat from a sealed torso.

In an advantageous embodiment, the housing wall encloses a circuit board of the robot. At least one unit is connected with the circuit board via a connector. Furthermore, the units, if there are two or more units, can be interconnected via at least one connector.

In a further advantageous embodiment, the robot torso comprises an inspection payload interface unit adapted for coupling an inspection payload to the torso. For a wide range of industrial inspection tasks, such an inspection payload carries visual and thermal cameras and a spotlight, in particular on a pan-tilt unit.

The robot torso might further comprise
an electrical interface unit adapted for coupling electronic connectors of an actuator of a limb of the robot,
a mechanical interface unit adapted for attaching a limb to the robot, a battery interface unit for connecting the robot torso to a battery which is in particular arranged outside of the torso, and a docking interface unit for docking the robot torus to a docking station in order to charge the battery.

All interfaces between the torso and the electrical unit, mechanical unit and any further unit like battery unit, payload interface unit or docking interface unit are sealed, such that no liquid or dirt might enter the torso through these interfaces.

In an advantageous embodiment of the invention, the cooling unit of the robot torso comprises a heat spreader, in particular a copper plate, arranged inside the robot torso and thermally coupleable to the heat source, in particular a central processing unit or similar. The heat spreader distributes thermal energy dissipated from the heat source to a larger surface area inside the robot torso in order to enable an improved and more effective heat transfer through the housing wall. Furthermore, a heat sink might be arranged outside the robot torso thermally coupled to the outer surface of the housing wall. The heat sink transfers heat to the environment by forced or natural convection.

In particular, the cooling unit comprises a thermally conductive and electrically insulating sheet. This sheet is thermally coupled to the heat spreader and to the inner surface of the housing wall of the torso.

In a further advantageous embodiment of the invention, a heat exchanger is arranged in thermal connection to the heat sink, for actively cooling the heat sink.

In particular, the heat sink comprises metallic cooling ribs, wherein the heat exchanger is adapted to force an airstream to pass the cooling ribs for cooling.

In a further advantageous embodiment, the heat sink is covered with an air duct comprising a fan for generating an air flow along the heat sink. The fan forces convective cooling of the heat sink. Alternatively, the heat sink is thermally connected to a heat exchanger.

Advantageously, the cooling unit comprises a thermally conductive layer adapted to thermally connect the heat spreader with the heat source.

In a further advantageous embodiment, the sensor unit comprises a sensor electronic arranged inside the robot torso. This sensor electronic is thermally coupled to the inner surface of the housing wall. An array of cooling ribs is arranged outside the robot torso. The cooling ribs are thermally coupled to the outer surface of the housing wall and distribute the heat energy to a large surface. This improves the heat transfer from the inside of the torso to the environment. A sensor element is arranged outside the robot torso. A connector, to connect the sensor element to the sensor electronic, passes a cable tunnel extending through a bulk section of the cooling ribs and through the housing wall.

Advantageously, the robot torso might comprise an alignment element for aligning the senor element with the cable tunnel, wherein the alignment element comprises at least one first feature that locks positively onto a feature of the array of cooling ribs and/or at least one second feature that locks positively onto a feature of the sensor element.

In a further advantageous embodiment, the face sensor unit comprises a sensor electronic arranged inside the robot torso. This sensor electronic is thermally coupled to the inner surface of the housing wall. A sensor element is arranged inside the robot torso and electrically connected to the sensor electronic. In particular, the sensor element detects signals from the outside through a window in the housing wall. An array of cooling ribs is arranged outside the robot torso. The cooling ribs are thermally coupled to the outer surface of the housing wall and distribute the heat energy to a large surface. This improves the heat transfer from the inside of the torso to the environment. The cooling ribs are adapted to cool the sensor electronic via the housing wall by means of transporting away the heat.

In an advantageous embodiment of the face sensor unit, the sensor electronic is arranged between the sensor element and the cooling ribs. In such an embodiment, a face sensor unit might be arranged at very narrow parts of the housing, where the housing inner surface can be thermally in contact with the sensor electronic on each side of the electronic.

Advantageously, the robot torso comprises a sensor protector, in particular with a window, in particular glass window, enclosing the sensor element of the sensor unit and/or the face sensor unit respectively.

The term "enclosing" here refers in particular to the protector that encloses the sensor element at least partially from one side. In particular, it does not refer to fully enclosing the sensor element.

In an advantageous embodiment, the sensor protector is protecting the sensor element of the sensor unit. In such an arrangement, an interface between the sensor protector and the outer side of the housing wall of the torso might be hermetically sealed. In particular, the same gaseous state exists inside the sensor protector and inside the robot torso, since the two are linked by the cable tunnel of through the bulk section of the cooling ribs of the sensor unit. In a further advantageous embodiment, the sensor protector is protecting the sensor element of the face unit sensor. In such an arrangement, since the sensor element of the face sensor unit is arranged within the torso at the inside of the housing wall, the sensor protector forms a part of the housing wall. In particular, also for such an arrangement, the same gaseous state exists inside the sensor protector and inside the robot torso, since the sensor protector forms a part of the housing wall.

Advantageously, the sensor protector is adapted to allow the sensor element to receive signals from the outside. In particular, it has a window, as mentioned above. Even if the sensor protector forms part of the housing wall for the face sensor unit, it can comprise a window for allowing the sensor unit to receive optical signals from the environment.

In particular, the sensor element comprises at least one optical sensor, in particular a wide-angle camera, a stereo camera, and/or an infrared camera, very particular a wide-angle camera and a stereo camera. The stereo camera might be used for acquiring depth information.

In a further advantageous embodiment of the invention, the robot torso might comprise a face structure. The face structure comprises a camera unit and at least one face sensor unit. In particular, there might be a second face sensor unit comprised. The camera is directed towards a specific first direction to detect a signal, in particular perpendicular to the window surface, or a direction in which the robot moves.

Advantageously, the camera unit is arranged adjacent to the at least one face sensor unit.

Further advantageously, the at least one face sensor unit is arranged adjacent to the second face sensor unit.

The at least one face sensor unit comprises a sensor element, wherein the sensor element is directed towards a second specific direction to sense a signal.

In particular, if a second face sensor unit is present, the second sensor element of the second face sensor unit is directed towards a third specific direction to detect a signal.

Advantageously, the specific first, second and if present third directions are aligned in one plane. In particular, if the specific first, second and if present third direction are aligned in one plane, an angle between the specific directions is α ≥10°, in particular α ≥20°.

In an advantageous embodiment of the invention, the camera unit, the at least one face sensor unit and the second face sensor unit if present in such a face structure are rigidly arranged to each other. This has the advantage that the camera unit, the at least one face sensor unit and the second face sensor unit, if present, monitor a defined area or region that is defined by the orientation of the individual units to each other and that is larger than the area or region that might be monitored by only one of the units alone.

In regard of possible temperature changes in the environment, this might cause moisture within the torso. Therefore, in a further advantageous embodiment of the invention, a section of the housing wall comprises a semi-permeable membrane, in particular a membrane permeable for water vapor.

Such a membrane can repel liquid water while allowing water vapor to pass through. Advantageously, a membrane might be used which is composed of stretched polytetrafluorethylene (PTFE).

Advantageously, the housing wall comprises aluminum for electromagnetically shielding electronic components arranged within the torso.

A second aspect refers to an in particular autonomous legged robot comprising the torso according to the first aspect. In particular, the robot has four legs and walks autonomously

BRIEF DESCRIPTION OF THE DRAWINGS

The invention will be better understood and objects other than those set forth above will become apparent from the following detailed description thereof. Such description makes reference to the annexed drawings, wherein:

FIGS. 5a and 5b show the face sensor structure according to FIG. 4 in a perspective view from a front and a back side; and FIG. 5c shows a cross section of the face structure.

DETAILED DESCRIPTION

Figure 1:
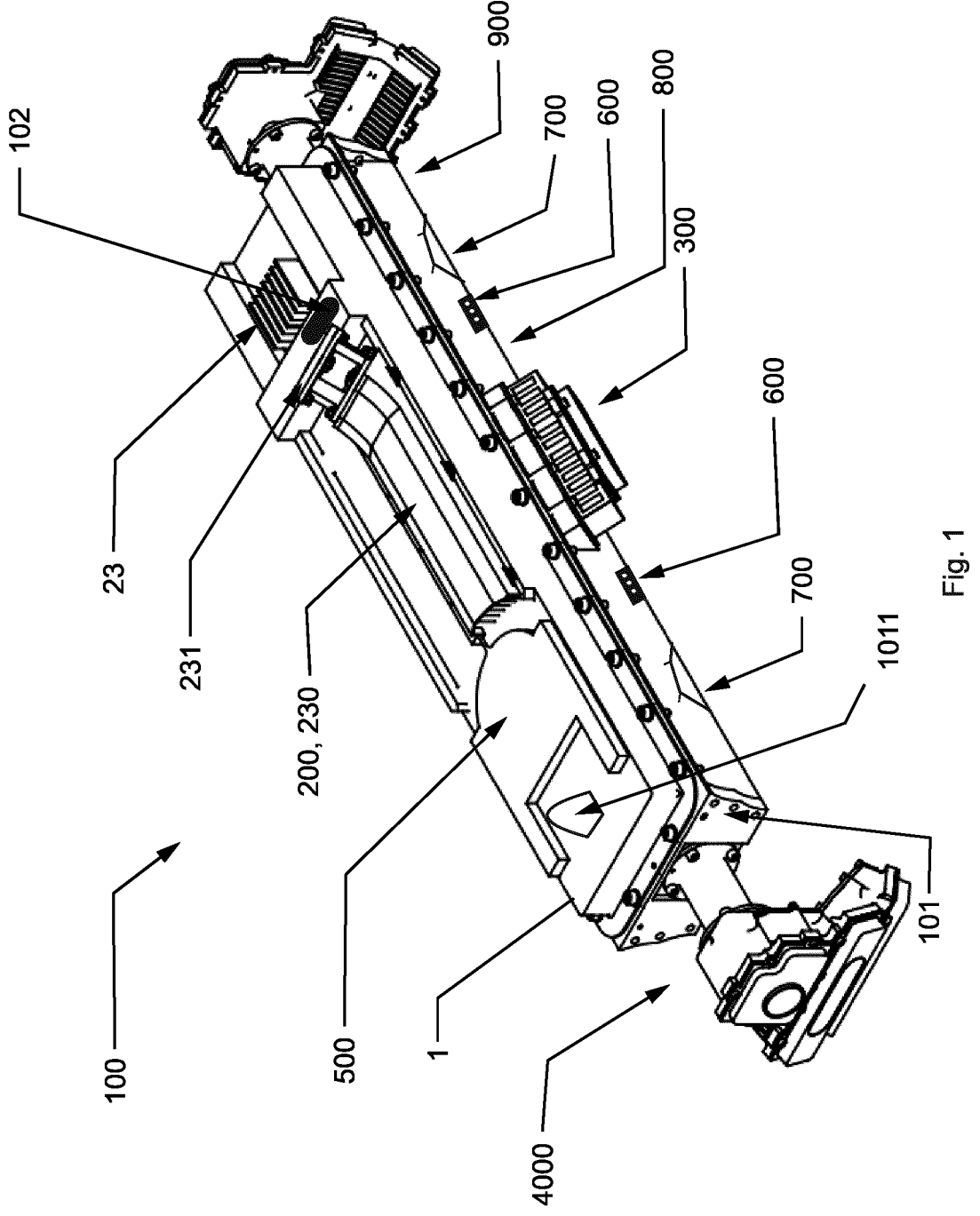
FIG. 1 shows a robot torso with several units integrated into the housing according to an embodiment of the invention.

FIG. 1 shows a robot torso 100. The robot torso 100 comprises a housing wall 1 with an inner sur-face and an outer surface. The housing wall 1 hermetically seals the inside of the robot torso 100 and advantageously might comprise aluminum for electromagnetically shielding electronic components arranged within the torso 100.

The robot torso 100 comprises a cooling unit 200, a sensor unit 300 arranged on the lateral side of the robot torso 100 and a face sensor unit 400 arranged at the front of the robot torso 100. Every of these units is integrated into the housing wall 1 of the robot torso 100.

Furthermore, the robot torso 100 comprises interfaces. An inspection payload interface unit 500 is arranged at the top of the robot torso 100. An inspection payload (not shown) can be coupled with it. The inspection payload carries visual and thermal cameras and a spotlight on a pan-tilt unit. These devices are used to perform inspections tasks. Technical defects of a device to be inspected can autonomously be detected by the robot with the payload interface. The inspection payload interface is sealed, such that no gas or liquid can enter or exit the torso through the interface.

An electrical interface unit 600 and mechanical interface units 700 are arranged at the lateral sides of the robot torso 100. Limbs (not shown) can be attached to the robot torso 100 via the mechanical interface units 700.

These limbs include actuators in order to move and bend the limbs. The actuators are electrically connected to the robot torso 100 via connectors attached to the electrical interface unit 600 and the limbs. The connecters transmit electrical energy to drive the actuators and connect the actuators with the control of the robot. The electrical 600 and mechanical 700 interface units are sealed, such that no gas or liquid can enter or exit the torso.

Furthermore, a battery can be attached out-side of the robot torso 100 at the battery interface unit 800. A docking interface unit 900 is arranged at the bottom of the robot torso 100. The battery inter-face unit 800 is sealed, such that no gas or liquid can enter or exit the torso.

All interfaces to the electrical unit 600, mechanical unit 700 and any further unit like battery unit, payload interface unit or docking interface unit are sealed, such that no liquid or dirt might enter the torso through these interfaces.

The robot torso 100 comprises an antenna 1011 at the front side and a user interface 102 in the rear part. In addition, the robot might comprise a semi-permeable membrane 101 at the front side and at the rear site of the torso. In particular, the membrane 101 is permeable for water vapor.

In particular, a robot according to a second aspect of the invention comprises a torso as shown in FIG. 1 completed with at least one leg.

Figure 2:
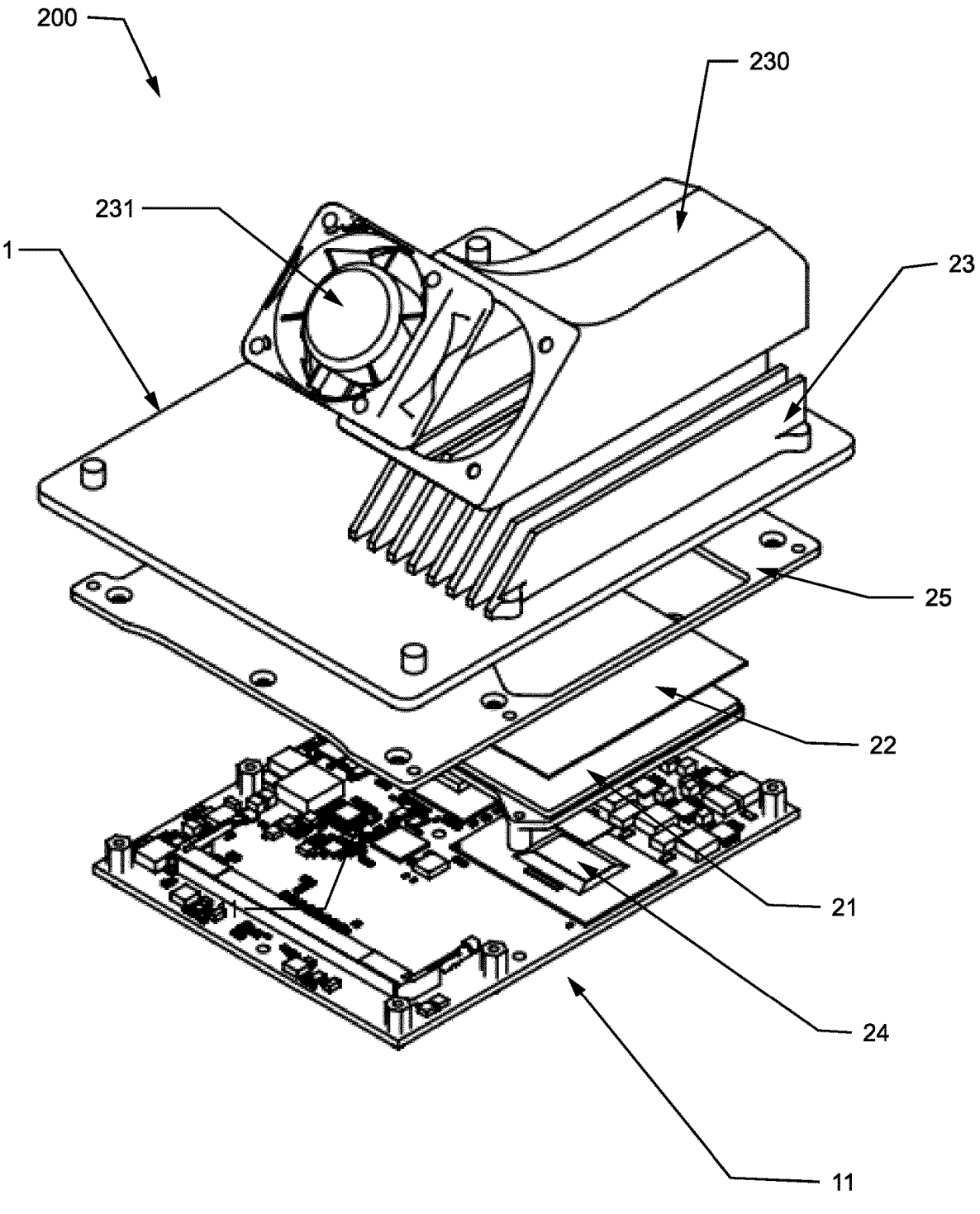
FIG. 2 shows a cooling unit of the robot torso of FIG. 1 in an exploded view according to an embodiment of the invention.

FIG. 2 shows an exploded view of the cooling unit 200. The housing wall 1 of the robot torso 100 is also visible in FIG. 2. All components shown in FIG. 2 below the housing wall 1 are arranged inside the robot torso 100 and all components shown in FIG. 2 above the housing wall 1 are arranged outside the robot torso 100. It is noted that the cooling unit 200 comprises components inside the robot torso 100 and components outside the robot torso 100. With other words, the cooling unit 200 is integrated into the housing wall 1.

In particular, such integration is possible as shown in FIG. 2 by means of mounting the unit including a section of the housing 1 into an opening of the torso 100, wherein all mounting interfaces are sealed.

The cooling unit 200 transfers heat from the inside of the torso 100 to the outside of the torso 200 via the housing wall 1. This is necessary, since the heat dissipated inside the robot torso 100 cannot be transferred out of the hermetically sealed robot torso by convection. The inside of the robot torso 100 would not be hermetically sealed if air could circulate between inside and outside of the robot torso 100.

Heat is dissipated by the CPU of the main circuit board or mother board 11 inside the robot torso 100. The CPU is the heat source. The dissipated heat is directly transferred from the CPU to the heat spreader 21 via a thermally conductive layer 24. The heat spreader 21 is a copper plate. Copper has a high thermal conductivity. The heat spreader 21 distributes the heat to a large surface such that a large transfer area of the housing wall 1 can be used in order to transfer heat from the inside to the outside of the torso. The heat spreader 21 is connected to the inner surface of the housing wall 1 via a fixture plate 25.

The housing wall 1 conducts the heat to the heat sink 23, which comprises a plurality of ribs arranged inside an air duct 230. These ribs have a large surface which improves the heat transfer to the environment. The heat transfer is speeded up by ventilating the air duct 230 by a fan 231. The fan 231 generates an airflow along the heat sink configured to force convective cooling of the heat sink.

Figure 3:
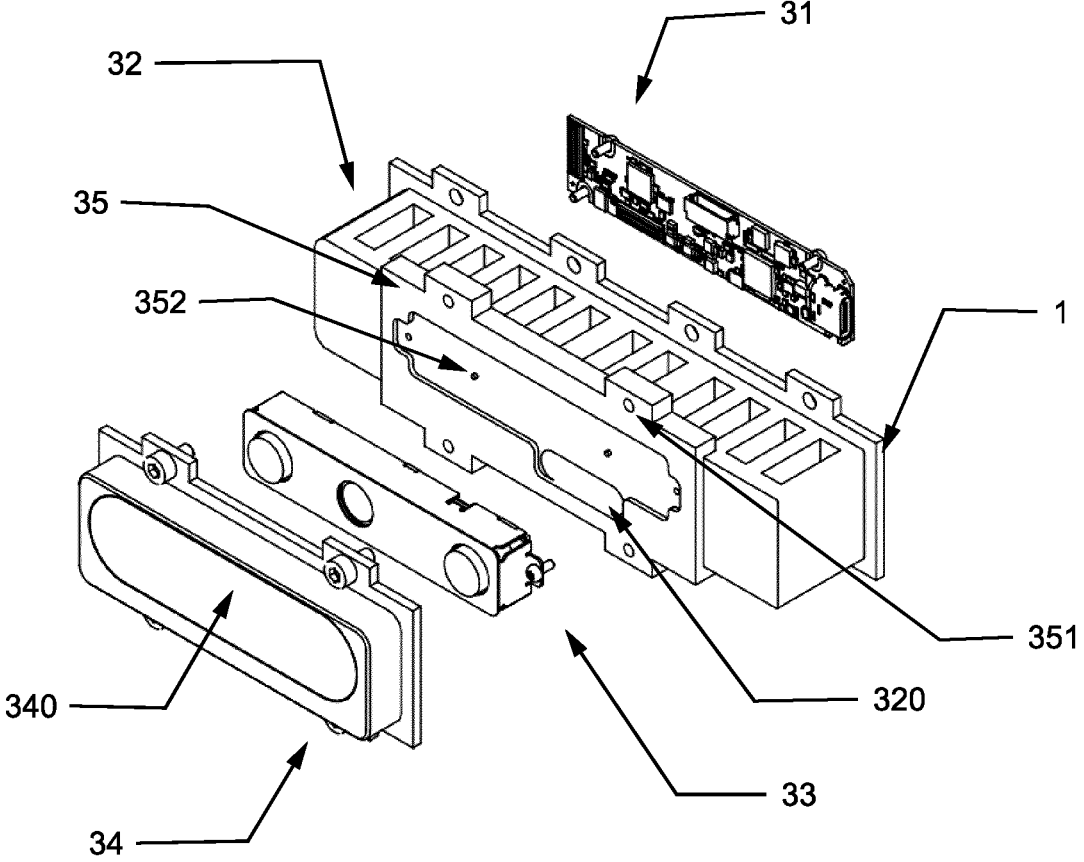
FIG. 3 shows a sensor unit of the robot torso of FIG. 1 in an exploded view according to an embodiment of the invention.

FIG. 3 shows an exploded view of the sensor unit 300. The sensor unit comprises a sensor electronic 31 which is arranged behind the housing wall 1, i.e. inside the robot torso 100. The sensor electronic 31 dissipates electric energy into heat. The heat is transferred out of the robot torso 100 through the housing wall 1 by conduction. An array of cooling ribs 32 arranged outside the torso distribute the heat on a large surface in order to speed up the heat transfer to the environment by convection only.

The sensor electronic 31 is connected with a sensor element 33 which can comprise an optical sensor, in particular a wide-angel camera, a stereo camera and/or an infrared camera for recording depth data. The sensor element 33 is arranged in front of the array of cooling ribs 32 and is connected with the sensor electronic 31 via cables passing through a cable tunnel 320 which is part of the array of cooling ribs 32.

Advantageously, an alignment element 35 mechanically connects the array of cooling ribs 32 with the sensor element 33. First features 351 of the alignment element 35 lock positively onto features of the array of cooling ribs 32 and second features 352 of the alignment element lock positively onto features of the sensor element 33. The sensor element 33 is enclosed by a sensor protector 34 comprising a window 340, in particular a glass window, such that the sensor protector 34 and the alignment element 35 hermetically seal the sensor element 33. The sensor element 33 is hermetically connected with the inside of the robot torso 100 via the cable tunnel 320.

Figure 3A:
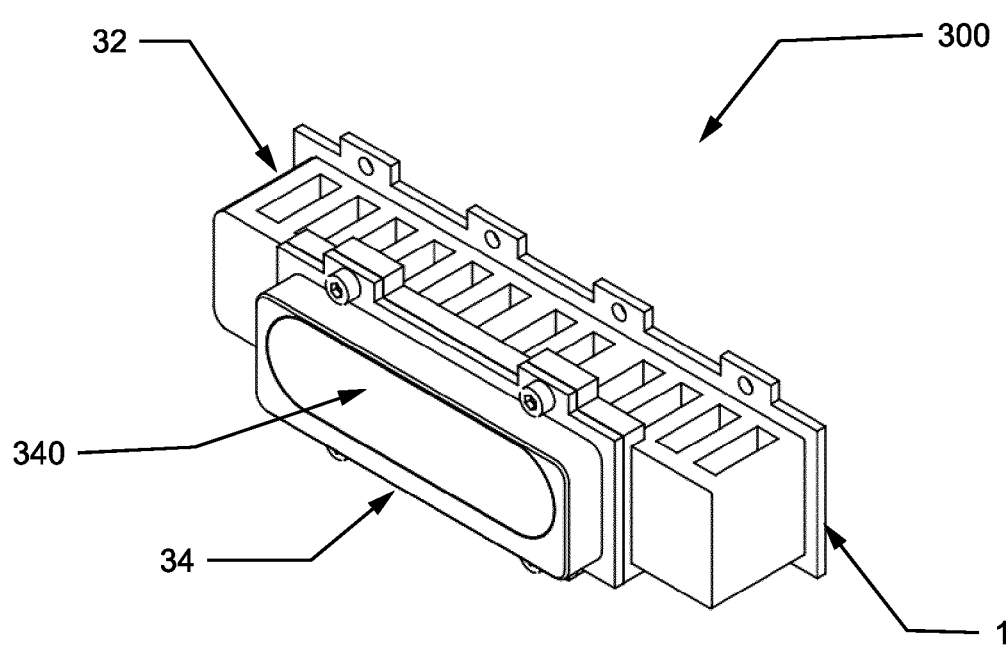
FIG. 3a shows the sensor unit of FIG. 3 in a non-exploded drawing.

FIG. 3a shows the sensor unit 300 of FIG. 3 in a non-exploded drawing. The sensor element 33 is not visible since it is enclosed by the sensor protector 34. The sensor element 33 has a visual connection to the environment through the window 340.

In particular, the interfaces between the sensor protector 34 enclosing the sensor element 33, an alignment element 35 and the array of cooling ribs 32 is sealed against the environment.

Figure 3B:
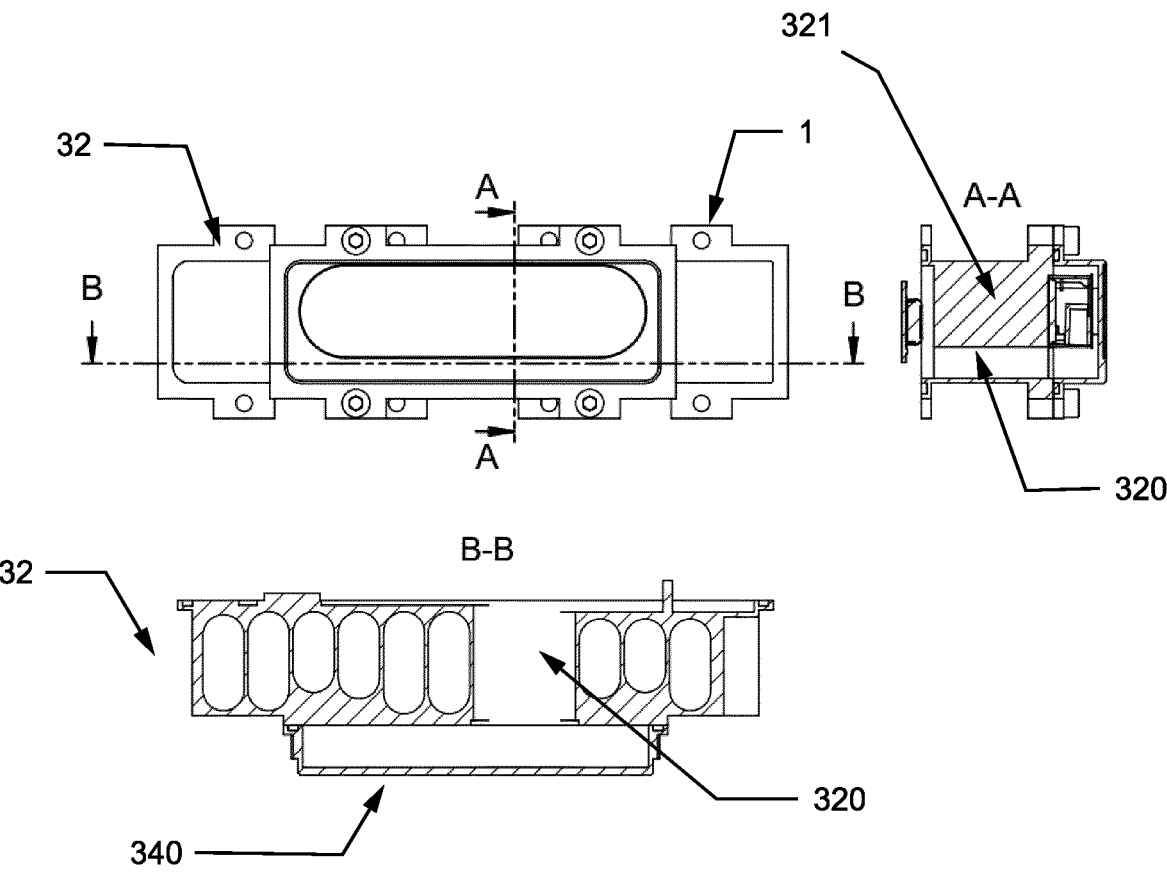
FIG. 3b shows different sectional views of the sensor unit of FIG. 3.

FIG. 3b shows three sectional views of the sensor unit 300. The cable tunnel 320 is well visible. The series of cooling ribs 32 is interrupted by the cable tunnel 320. The cable tunnel 320 is not interconnected with the open spaces between the cooling ribs 32 since the cable tunnel is part of the hermetically sealed room consisting of the inside of the robot torso 100, the inside of the sensor protector 34 and the cable tunnel 320.

Figure 4:
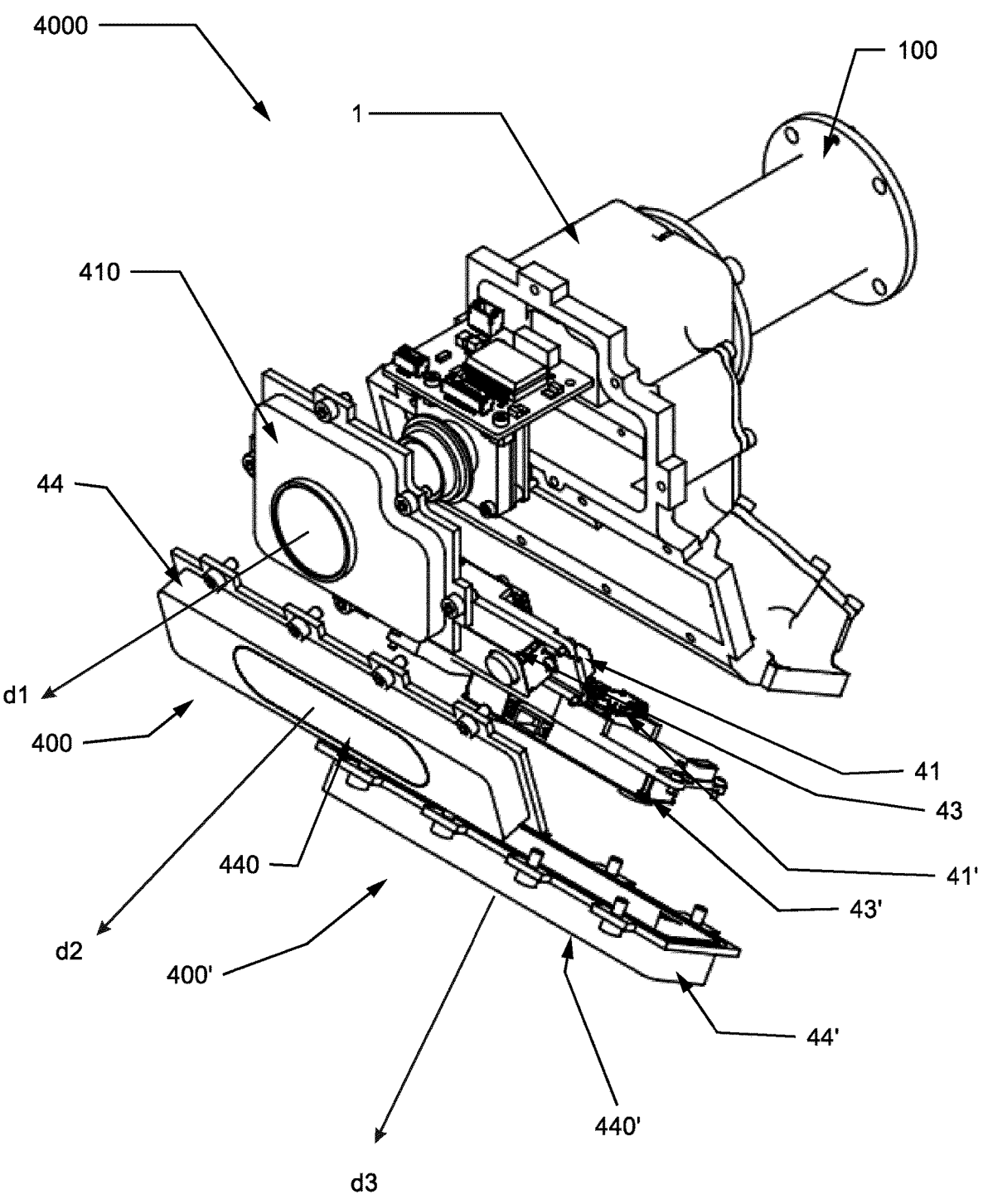
FIG. 4 shows a face structure of the robot torso of FIG. 1 in an exploded view according to an embodiment of the invention.

FIG. 4 shows an exploded view of a face structure 4000 comprising a camera unit 410 and a first face sensor unit 400 and a second face sensor unit 400'.

The face sensor units 400, 400' each comprise a sensor electronic 41, 41' arranged inside the robot torso 100 and thermally coupling to the inner surface of the housing wall 1 of the torso 100. An array of face sensor cooling ribs 42, 42' for each face sensor unit 400, 400' is arranged outside the torso 100 and thermally coupled to the outer surface of the housing wall (visible in FIG. 5b).

A sensor element 43, 43' for each face sensor unit 400, 400' is arranged inside the torso 100, and connected to the sensor electronic 41, 41'. The sensor electronic 41, 41' for each face sensor unit 400, 400' is arranged between the respective sensor element 43, 43' and the array of face sensor cooling ribs 42, 42'.

Advantageously, a sensor protector 44, 44' encloses each sensor element 43, 43', wherein each sensor protector 44, 44' is formed as a part of the housing wall 1.

Therefore, each sensor element 43, 43' is arranged within the torso 100. The sensor protector 44, 44' is sealed so that no fluid or gas might enter the torso 100.

In particular, the sensor protector 44, 44' forms a part of the housing wall 1 here, which is why we can define the sensor element 43, 43' being enclosed by the housing wall 1 or the sensor protector 44, 44' without being contradictory.

The housing wall 1 or the sensor protector 44, 44' respectively surrounding the respective sensor element 43, 43' comprises a window 440, 440', to allow the respective sensor element 43, 43' to detect signals from the outside. An interface of the respective window 440, 440' and the outer side of the housing wall 1 or the sensor protector 44, 44' respectively, is hermetically sealed.

Advantageously, each sensor element 400, 400' comprises at least one optical sensor, in particular a wide-angle camera, a stereo camera, and/or an infrared camera, very particular a wide-angle camera and a stereo camera.

The camera unit 410 comprises a camera directed towards a first specific direction d1 to detect a first signal. The at least one face sensor unit 400 comprises the sensor element 41 that is directed towards a specific second direction d2 to detect a second signal. The second face sensor unit 400' is directed towards a third specific direction d3 to detect a third signal.

FIGS. 5a and 5b show a perspective view of the face structure 4000 shown in an exploded view in FIG. 4. In the advantageous embodiment of the face structure as shown in FIG. 5a, it is clearly visible that the camera unit 410 is arranged adjacent, in alignment, to the at least one face sensor unit 400.

Further advantageously, the at least one face sensor unit 400 is arranged adjacent, in an alignment, to the second face sensor unit 400'.

FIG. 5c shows a cross section of a side view of the face structure 4000 of FIGS. 5a and 5b. In particular the arrangement of the camera unit 410, the face sensor unit 400 and the second face sensor unit 400' is visible. Furthermore, the directions d1, d2, and d3 laying in a plane (the paper plane) are marked. In particular, an angle $\alpha$, with $\alpha \geq 10°$, very particular with $\alpha \geq 20°$.

What is claimed:

1. A robot torso, in particular for a legged robot, comprising:

a housing wall with an inner surface and an outer surface, at least one unit integrated into the housing wall, wherein the at least one unit is selected from the list consisting of a cooling unit for cooling a heat source inside the torso, a sensor unit, a face sensor unit, or a camera unit
wherein the at least one unit comprises
a heat source arranged inside the torso and thermally coupled to the housing wall, and
a heat sink arranged outside the torso and thermally coupled to the housing wall for cooling the heat source,
wherein the housing wall is essentially hermetically sealing the torso.

2. The robot torso according to claim 1, wherein the cooling unit comprises:
a heat spreader arranged inside the robot torso and thermally couplable to the heat source and
a heat sink arranged outside the robot torso thermally coupled to the outer surface of the housing wall of the torso, and
in particular a thermally conductive and electrically insulating sheet thermally coupling to the heat spreader and to the inner surface of the housing wall of the torso.

3. The robot torso according to claim 2, wherein a heat exchanger is arranged in thermal connection to the heat sink, for actively cooling the heat sink, in particular, wherein the heat sink comprises metallic cooling ribs, wherein the heat exchanger is adapted to force an airstream to pass the cooling ribs for cooling.

4. The robot torso according to claim 2, wherein to force active cooling of the heat sink, the heat sink is covered with an air duct comprising a fan for generating an air flow along the heat sink configured to force convective cooling of the heat sink.

5. The robot torso according to claim 1, wherein the cooling unit comprises further a thermally conductive layer adapted to thermally connect the heat spreader with the heat source.

6. The robot torso according to claim 1, wherein the sensor unit comprises:
a sensor electronic arranged inside the robot torso and thermally coupling to the inner surface of the housing wall of the torso
an array of cooling ribs arranged outside the robot torso thermally coupled to the outer surface of the housing wall,
a sensor element arranged outside the robot torso, wherein a connector from the sensor element to the sensor electronic passes a cable tunnel extending through a bulk section of the cooling ribs and through the housing wall.

7. The robot torso according to claim 6, wherein the sensor unit further comprises an alignment element for aligning the sensor element with the cable tunnel, wherein the alignment element comprises at least one first feature that locks positively onto a feature of the array of cooling ribs and/or at least one second feature that locks positively onto a feature of the sensor element.

8. The robot torso according to claim 1, wherein the face sensor unit comprises:
a sensor element arranged inside the robot torso, in particular, wherein signals from the outside of the torso are detectable through a window in the housing wall,
a sensor electronic arranged inside the robot torso, electrically connected to the sensor element, and thermally coupling to the inner surface of the housing wall of the robot torso
an array of face sensor cooling ribs arranged outside the robot torso thermally coupled to the outer surface of the housing wall, for cooling the sensor electronic.

9. The robot torso according to claim 6, further comprising:

a sensor protector enclosing the sensor element, in particular, wherein the sensor protector comprises a window.

10. The robot torso according to claim 6, wherein the sensor element comprises at least one optical sensor, in particular a wide-angle camera, a stereo camera, and/or an infrared camera, very particular a wide-angle camera and a stereo camera.

11. The robot torso according to claim 1, comprising a face structure comprising:
a camera unit comprising a camera directed towards a first specific direction to detect a first signal,
at least one face sensor unit, wherein the at least one face sensor unit comprises:
a sensor element arranged inside the robot torso, in particular, wherein signals from the outside of the torso are detectable through a window in the housing wall,
a sensor electronic arranged inside the robot torso, electrically connected to the sensor element, and thermally coupling to the inner surface of the housing wall of the robot torso, and
an array of face sensor cooling ribs arranged outside the robot torso thermally coupled to the outer surface of the housing wall, for cooling the sensor electronic,
wherein the sensor element is directed towards a second specific direction to detect a second signal,
in particular a second face sensor unit with a second sensor element directed towards a third direction to detect a third signal, wherein the second face sensor unit comprises:
a sensor element arranged inside the robot torso, in particular, wherein signals from the outside of the torso are detectable through a window in the housing wall,
a sensor electronic arranged inside the robot torso, electrically connected to the sensor element, and thermally coupling to the inner surface of the housing wall of the robot torso, and
an array of face sensor cooling ribs arranged outside the robot torso thermally coupled to the outer surface of the housing wall, for cooling the sensor electronic.

12. The robot torso according to claim 1, wherein the housing wall encloses within the torso:
a circuit board of the robot,
a connector from the circuit board to the at least one unit, and/or
connectors between the at least one unit and a further unit, if there is any.

13. The robot torso according to claim 1 further comprising:
an inspection payload interface unit adapted for coupling an inspection payload to the torso,
an electrical interface unit adapted for coupling electronic connectors of a actuator of a limb of the robot,
a mechanical interface unit adapted for attaching to a limb of the robot,
a battery interface unit for connecting the robot torso to a battery, and
a docking interface unit for docking the robot torso to a docking station.

14. The robot torso according to claim 1, wherein the housing wall comprises aluminium for electromagnetically shielding electronic components arranged within the torso.

15. A robot torso according to claim 1, wherein a section of the housing wall comprises a semi-permeable membrane, in particular a membrane permeable for water vapour.

16. An autonomous legged robot comprising the robot torso according to claim 1.

* * * * *